US011450696B1

(12) United States Patent
Zang et al.

(10) Patent No.: US 11,450,696 B1
(45) Date of Patent: Sep. 20, 2022

(54) DUAL FLOATING DIFFUSION TRANSISTOR WITH VERTICAL GATE STRUCTURE FOR IMAGE SENSOR

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 53 days.

(21) Appl. No.: 17/229,664

(22) Filed: Apr. 13, 2021

(51) Int. Cl.
*H04N 5/374* (2011.01)
*H04N 5/378* (2011.01)
*H04N 5/355* (2011.01)
*H01L 27/146* (2006.01)
*H04N 5/3745* (2011.01)

(52) U.S. Cl.
CPC .. *H01L 27/14614* (2013.01); *H01L 27/14603* (2013.01); *H01L 27/14643* (2013.01); *H04N 5/378* (2013.01); *H04N 5/3745* (2013.01)

(58) Field of Classification Search
CPC .. H04N 5/378; H04N 5/3745; H04N 5/37452; H04N 5/3559; H01L 27/14614; H01L 27/14603; H01L 27/14643
See application file for complete search history.

(56) References Cited

U.S. PATENT DOCUMENTS

| 10,044,960 | B2 | 8/2018 | Mao et al. | |
|---|---|---|---|---|
| 10,334,191 | B1* | 6/2019 | Yang | H04N 5/35563 |
| 11,140,352 | B1* | 10/2021 | Dai | H04N 5/378 |
| 2013/0256510 | A1* | 10/2013 | Lyu | H04N 5/37457 |
| | | | | 250/208.1 |
| 2017/0347047 | A1* | 11/2017 | Mao | H04N 5/374 |
| 2018/0098008 | A1* | 4/2018 | Man | H04N 5/378 |
| 2018/0302579 | A1* | 10/2018 | Manabe | H01L 27/14609 |
| 2018/0366513 | A1* | 12/2018 | Yang | H01L 27/14831 |
| 2021/0202553 | A1* | 7/2021 | Mun | H01L 24/14616 |
| 2022/0013554 | A1* | 1/2022 | Mun | H01L 27/14643 |
| 2022/0043551 | A1* | 1/2022 | Mun | H01L 27/14616 |

\* cited by examiner

*Primary Examiner* — Marly S Camargo
(74) *Attorney, Agent, or Firm* — Perkins Coie LLP

(57) ABSTRACT

A pixel circuit includes a photodiode and a floating diffusion disposed in a semiconductor substrate. A transfer gate is disposed between the photodiode and the floating diffusion to transfer photogenerated image charge from the photodiode to the floating diffusion. A dual floating diffusion (DFD) transistor is coupled between the floating diffusion and a DFD capacitor. The DFD transistor includes a DFD gate that includes a planar gate portion disposed over a surface of the semiconductor substrate and a vertical gate portion that extends vertically from the planar gate portion into the semiconductor substrate. The vertical gate portion of the DFD gate is configured to increase a gate to substrate coupling capacitance of the DFD transistor. The gate to substrate coupling capacitance and the DFD capacitor are coupled to increase an effective capacitance associated with the floating diffusion in response to the DFD transistor being turned on.

30 Claims, 5 Drawing Sheets

FIG. 3A    FIG. 3B

DUAL FLOATING DIFFUSION TRANSISTOR WITH VERTICAL GATE STRUCTURE FOR IMAGE SENSOR

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. One common technique to increase dynamic range is to merge multiple exposures captured with different exposure settings using standard (low dynamic range) image sensors into a single linear HDR image, which results in a much larger dynamic range image than a single exposure image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A illustrates a plan view of an example DFD transistor including a DFD gate structure that includes a vertical portion in accordance with the teachings of the present invention.

FIG. 3B illustrates a longitudinal cross-section view of an example DFD transistor including a DFD gate structure that includes a vertical portion in accordance with the teachings of the present invention.

Figure 1:
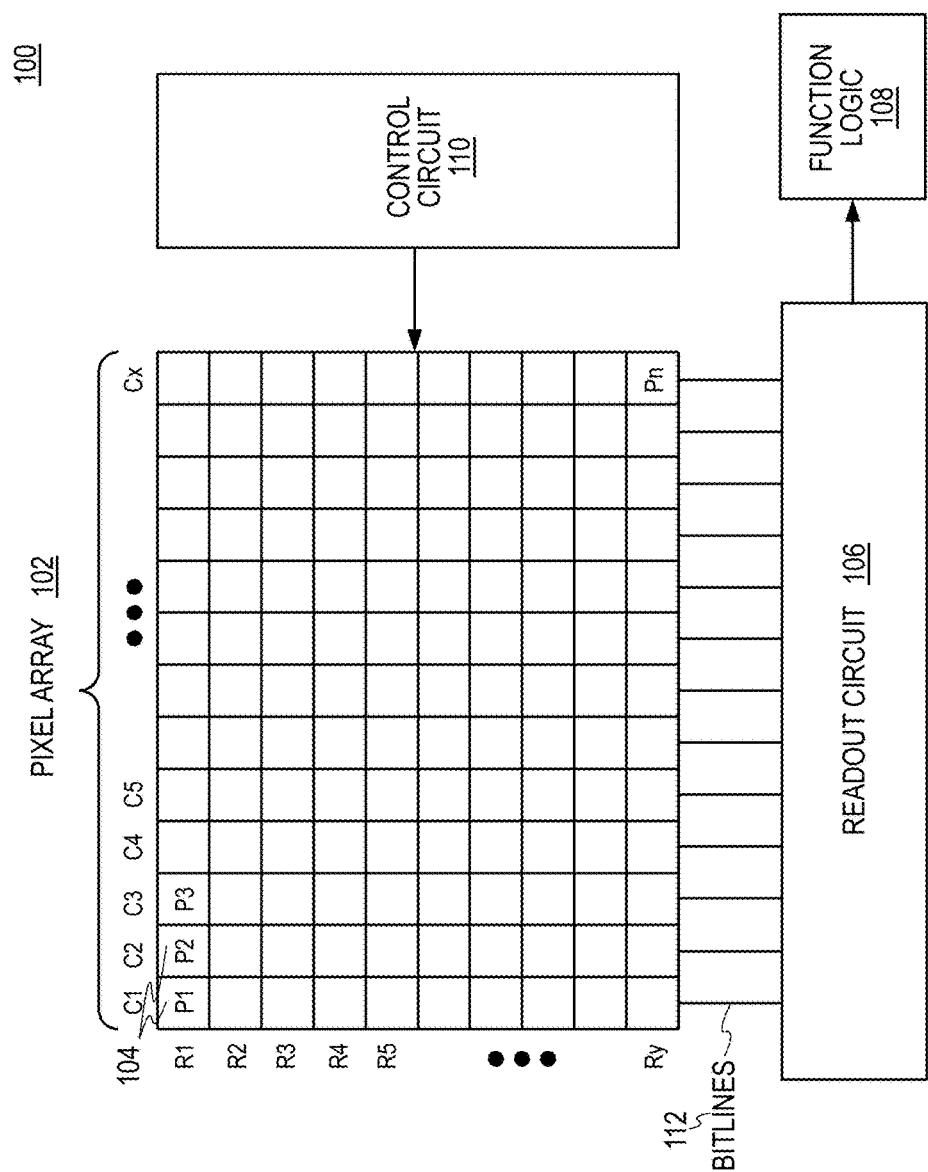
FIG. 1 illustrates one example of an imaging system including a high dynamic range pixel array with pixel circuits that include dual floating diffusion (DFD) transistors with DFD gate structures that include one or more vertical portions in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a high dynamic range (HDR) pixel array with pixel circuits that include dual floating diffusion (DFD) transistors with DFD gate structures that include one or more vertical portions are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including an HDR pixel array with pixel circuits that include dual floating diffusion (DFD) transistors with DFD gate structures that include one or more vertical portions are described. In various examples, the DFD transistors provide the pixel circuits with switchable conversion gain to achieve good signal to noise ratio with high conversion gain (HCG) in low light and low conversion gain (LCG) in bright light to realize a high dynamic range. When the DFD transistor is turned off, a pixel circuit is configured to have high conversion gain, which is determined mostly by the junction capacitance associated with the floating diffusion of the pixel circuit. When the DFD transistor is turned on, the pixel circuit is configured to have low conversion gain, which is determined by the junction capacitance associated with the floating diffusion as well as the gate to substrate coupling capacitance of the DFD transistor and a DFD capacitor coupled to the DFD transistor, which are coupled to the floating in accordance with the teachings of the present invention.

In various examples, the DFD transistor has a DFD gate structure that includes a planar gate portion disposed over a surface of a semiconductor substrate and at least one vertical gate portion that extends vertically from the planar gate portion into the semiconductor substrate. The vertical gate portion of the DFD gate structure increases the gate to substrate coupling capacitance of the DFD transistor, which increases the effective capacitance associated with the floating diffusion when the DFD transistor is turned on in accordance with the teachings of the present invention. As a result, the total effective capacitance associated with the floating diffusion during an LCG operation of the pixel circuit is further increased when the DFD transistor is turned on. When the DFD transistor is turned off, the increased gate to substrate coupling capacitance provided by the vertical gate portion of the DFD gate structure has no impact on HCG operation of the pixel circuit. As a result, the ratio of HCG to LCG of the pixel circuit is even higher, which further widens the dynamic range of the pixel circuit with a DFD transistor in accordance with the teachings of the present invention.

To illustrate, FIG. 1 illustrates one example of an imaging system 100 including a high dynamic range pixel array with pixel circuits that include dual floating diffusion (DFD) transistors in accordance with the teachings of the present invention. In the various examples, the DFD transistors include DFD gate structures that include one or more vertical portions in accordance with the teachings of the present invention. As shown in the illustrated example, imaging system 100 includes a pixel array 102, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

As will discussed in greater detail below, in one example, each pixel circuit 104 includes one or more photodiodes that photogenerate image charge in response to incident light. After each pixel circuit 104 has acquired its image charge, the corresponding analog image charge values are read out by readout circuit 106 through column bitlines 112 by readout circuit 106. In the example, each pixel circuit 104 also includes a dual floating diffusion (DFD) transistor, which can be turned on or off to set or adjust the conversion gain of the pixel circuit 104 to LCG or HCG during readout operations. In the various examples, the DFD transistor includes a DFD gate structure with one or more vertical portions, which increases the effective capacitance associated with a floating diffusion during a LCG operation of the pixel circuit 104 when the DFD transistor is turned on. In the example, the DFD transistor can be turned off to decrease the effective capacitance associated with a floating diffusion during an HCG operation of the pixel circuit 104 without affecting HCG performance.

In the various examples, the analog image charge signals may be converted to digital values with an analog to digital converter (ADC) included in the readout circuit 106. In various examples, readout circuit 106 may also include amplification circuitry, or otherwise. The digital representations of the image charge values may then be transferred to function logic 108. Function logic 108 may simply store the image charge values or even manipulate the image data by applying post image effects (e.g., crop, rotate, remove red eye, adjust brightness, adjust contrast, or otherwise). In one example, readout circuit 106 may read out one row of image charge values at a time along column bitlines 112 (illustrated) or may read out the image charge values using a variety of other techniques (not illustrated), such as a serial read out or a full parallel readout of all pixel circuits 104 simultaneously.

In one example, control circuit 110 is coupled to pixel array 102 to control operational characteristics of pixel array 102. For instance, in one example, control circuit 110 generates the transfer gate signals, the DFD transistor signals, and other control signals to control the gain, transfer, and readout of image data from all of the pixel circuits 104 of pixel array 102. In addition, control circuit 110 may generate a shutter signal for controlling image acquisition. In one example, the shutter signal is a global shutter signal for simultaneously enabling all pixel circuits 104 within pixel array 102 to simultaneously capture their respective image charge values during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2:
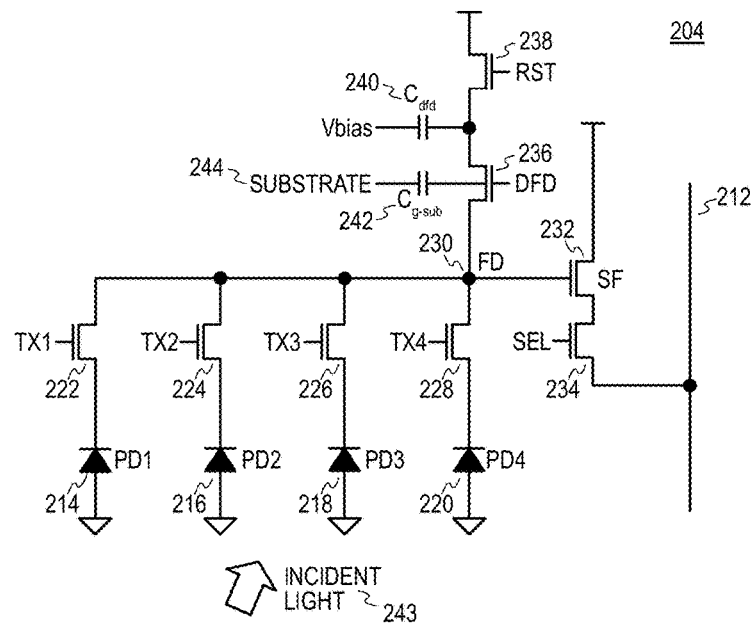
FIG. 2 illustrates one example schematic of a pixel circuit of a high dynamic range CMOS image sensor including that includes a DFD transistor with a DFD gate structure that includes one or more vertical portions in accordance with the teachings of the present invention.

FIG. 2 illustrates one example schematic of a pixel circuit 204 of a high dynamic range CMOS image sensor including that includes a DFD transistor with a DFD gate structure that includes one or more vertical portions in accordance with the teachings of the present disclosure. It is appreciated that the example schematic of pixel circuit 204 of FIG. 2 may be one example of one of the pixel circuits 104 of the pixel array 102 as shown in FIG. 1, and that similarly named and numbered elements described above are coupled and function similarly below.

In the depicted example, pixel circuit 204 includes a plurality of photodiodes, including photodiode PD1 214, photodiode PD2 216, photodiode PD3 218, and photodiode PD4 220. It is appreciated that in the depicted example, pixel circuit 204 includes four photodiodes for explanation purposes, and that in other examples, pixel circuit 204 may include a single photodiode or a greater number of photodiodes in accordance with the teachings of the present invention.

Continuing with the example illustrated in FIG. 2, each of the one or more photodiodes including photodiode PD1 214, photodiode PD2 216, photodiode PD3 218, and photodiode PD4 220, is configured to photogenerate image charge in response to incident light 243. In the depicted example, pixel circuit 204 also includes a floating diffusion FD 230, which is coupled to receive the image charge from the plurality of photodiodes, including photodiode PD1 214, photodiode PD2 216, photodiode PD3 218, and photodiode PD4 220.

The example depicted in FIG. 2 also shows a plurality of transfer gates including a first transfer gate 222, second transfer gate 224, third transfer gate 226, and fourth transfer gate 228, which are coupled between floating diffusion FD 230 and the respective photodiodes, including photodiode PD1 214, photodiode PD2 216, photodiode PD3 218, and photodiode PD4 220. In operation, the first transfer gate 222, second transfer gate 224, third transfer gate 226, and fourth transfer gate 228 are configured to transfer the image charge photogenerated in photodiode PD1 214, photodiode PD2 216, photodiode PD3 218, and photodiode PD4 220 to floating diffusion 230 in response to transfer gate signals TX1, TX2, TX3, and TX4, respectively.

The illustrated example shows that pixel circuit 204 also includes a source follower transistor SF 232 having a drain coupled to a supply voltage and a gate coupled to the floating diffusion FD 230. A row select transistor 234 is coupled to a source of the source follower transistor SF 232 and a column bitline 212, and is coupled to be controlled in response to a select signal SEL. In operation, the source follower transistor SF 232 is coupled to output an image signal to the bitline 212 through select transistor 234 in response to the image charge in the floating diffusion FD 230. In one example, a readout circuit (e.g., readout circuit 106 of FIG. 1) is coupled to bitline 212 to read out the image signal from bitline 212.

Continuing with the example depicted in FIG. 2, pixel circuit 204 also includes a dual floating diffusion (DFD) transistor 236 coupled between the floating diffusion FD 230 and a DFD capacitor $C_{dfd}$ 240. In the depicted example, the DFD capacitor $C_{dfd}$ 240 is coupled between a bias voltage Vbias and the source of the DFD transistor 236. A reset transistor 238 is coupled between the supply voltage and the DFD transistor 236. In operation, reset transistor 238 may be configured to reset the floating diffusion FD 230, as well as reset photodiode PD1 214, photodiode PD2 216, photodiode PD3 218, and photodiode PD4 220 in response to a reset control signal RST and a DFD control signal DFD as shown.

As will be discussed, in the various examples, the DFD transistor 236 includes a DFD gate structure, which includes a planar gate portion disposed over the surface of a semiconductor substrate as well as one or more vertical gate portions, which extend vertically from the planar gate portion into the semiconductor substrate. In one example, an associated channel is formed along at least a portion of the DFD gate structure of the DFD transistor 236 and beneath the surface of the semiconductor substrate between the source region and drain region of the DFD transistor 236 when DFD transistor 236 is turned on. In the various examples, the one or more vertical gate portions of the DFD gate structure are configured to increase a gate to substrate coupling capacitance $C_{g-sub}$ 242 of the DFD transistor 236 between the DFD gate structure and the semiconductor substrate. In operation, the gate to substrate coupling capacitance $C_{g-sub}$ 242 of the DFD transistor 236 and the DFD capacitor $C_{dfd}$ 240 are coupled to floating diffusion FD 230 to increase an effective capacitance associated with the floating diffusion FD 230 reducing conversion gain of the pixel circuit 204 in response to the DFD transistor 236 being turned on during a LCG operation in accordance with the teachings of the present invention.

FIG. 3A illustrates a plan view of an example DFD transistor 336 including a DFD gate structure that includes a vertical portion in accordance with the teachings of the present disclosure. It is appreciated that the example DFD transistor 336 of FIG. 3A may be one example of the DFD transistor 236 of FIG. 2 or one example of the DFD transistors included in pixel circuits 104 as shown in FIG. 1, and that similarly named and numbered elements described above are coupled and function similarly below.

As shown in the plan view example depicted in FIG. 3A, the DFD transistor 336 includes a DFD gate structure with a planar gate portion 336A disposed over the surface of a semiconductor substrate 344. In one example, the semiconductor substrate 344 includes silicon. In the example, the DFD gate structure of DFD transistor 336 also includes a vertical gate portion 336B, which extends vertically from the planar gate portion 336A into the semiconductor substrate 344. In one example, vertical gate portion 336B extends into the semiconductor substrate 344 between the source/drain regions of the DFD transistor 336. It is appreciated that the channel of the DFD transistor 336 is formed in the semiconductor substrate 344 beneath the DFD gate structure, including beneath planar gate portion 336A, along bottom and/or part of the side walls of the vertical gate portion 336B, between source/drain regions in the semiconductor substrate 344 of the DFD transistor 336.

In the depicted example, it is further appreciated that the channel and the source/drain regions of DFD transistor 336 are isolated from active pixel region in the semiconductor substrate 344 with shallow trench isolation (STI) structures 352 that are disposed in the semiconductor substrate 344 along lateral sides of the DFD transistor 336 as shown. In various examples, the STI structures 352 include a trench structure filled with an oxide material, or other suitable isolation material. In various examples, the STI structures 352 provide isolation between transistor region and active pixel region. The vertical gate portion 336B of the DFD gate structure of DFD transistor 336 is configured to increase a gate to substrate coupling capacitance of the DFD transistor 336 when the DFD transistor is turned on. As discussed above, the gate to substrate coupling capacitance provided with DFD gate structure of DFD transistor 336 is configured to increase an effective capacitance associated with a floating diffusion coupled to the DFD transistor 336 in response to the DFD transistor 336 being turned on during LCG operation in accordance with the teachings of the present invention.

FIG. 3B illustrates a longitudinal cross-section view of an example DFD transistor 336 including a DFD gate structure that includes a vertical portion in accordance with the teachings of the present disclosure. It is appreciated that the example DFD transistor 336 illustrated in FIG. 3B may be a longitudinal cross-section view of the example of the DFD transistor 336 of FIG. 3A along dashed line A-A', or one example of the DFD transistor 236 of FIG. 2, or one example of the DFD transistors included in pixel circuits 104 as shown in FIG. 1, and that similarly named and numbered elements described above are coupled and function similarly below.

As shown in the longitudinal cross-section view of the example depicted in FIG. 3B, the DFD gate structure of DFD transistor 336 includes a planar gate portion 336A disposed over a surface 358 of a semiconductor substrate 344. In one example, the surface 358 is a front side surface of semiconductor substrate 344. In the example, the DFD gate structure of DFD transistor 336 also includes a vertical gate portion 336B, which extends vertically from the planar gate portion 336A into the semiconductor substrate 344 between source region 350 and rain region 348. In an example, the channel of the DFD transistor 336 is formed beneath the DFD gate structure, including along bottom and/or side walls of vertical gate portion 336B, beneath the surface 358 of the semiconductor substrate 344 underneath planar gate portion 336A, between source region 350 and drain region 348 of the DFD transistor 336.

In various examples, the depth of vertical gate portion 336B may be approximately ~300-400 nanometers, which as shown in the depicted example is a deeper depth than the junction depths of source region 350 and drain region 348 in semiconductor substrate 344. In the various examples, it is also appreciated that the vertical gate portion 336B may have a pillar structure and have a cross-sectional width in the range of approximately ~20-100 nanometers depending on the gate size of the DFD gate structure of DFD transistor 336. It is noted that these dimensions are provided for explanation purposes and that in other examples, it is appreciated that the dimensions of vertical gate portion 336B and/or gate structure 336 may be different depending on the desired gate to substrate capacitance and/or process design rules in accordance with the teachings of the present invention.

In one example, the source region 350 is coupled to a floating diffusion FD 330 through a conductive path 354, and the drain region 348 is coupled to a DFD capacitor $C_{dfd}$ 340 through a conductive path 356. In the various examples, it is appreciated that conductive paths 354 and 356 may include contacts and metal layer interconnects that are formed in one or more interlayer dielectric layers of a chip on which the pixel circuit 104 including the DFD transistor 336 is fabricated. In embodiments, the thickness of gate oxide layer of DFD transistor 336 is different from the thickness of gate oxide layer of at least one pixel transistor. As shown in the example depicted in FIG. 3B, it is appreciated that a thin gate oxide layer 346 is formed between the DFD gate structure of DFD transistor 336 and the semiconductor substrate 344. In one example, gate oxide layer 346 has a thickness of approximately ~30-45 angstroms. In embodiments, the thin gate oxide layer 346 of DFD transistor 336 is thinner than a gate oxide layer thickness (e.g., about 70-100 angstroms) of a pixel transistor such as a gate oxide layer of transfer gate, a reset transistor, or a row-select transistor.

The vertical gate portion 336B of the DFD gate structure of DFD transistor 336 is configured to increase a gate to substrate coupling capacitance of the DFD transistor 336. In one example, a thin gate oxide layer 346 may further increase the gate to substrate coupling capacitance of the DFD transistor 336. As discussed above, the gate to substrate coupling capacitance provided with DFD gate structure of DFD transistor 336 is configured to increase an effective capacitance associated with the floating diffusion FD 330 that is coupled to the DFD transistor 336 to reduce conversion gain of associated pixel circuit in response to the DFD transistor 336 being turned on during LCG operation in accordance with the teachings of the present invention.

Figure 3C:
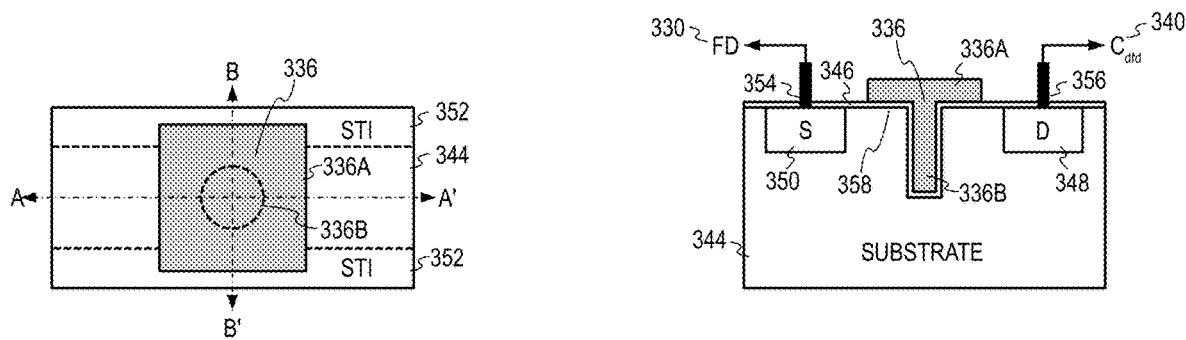
FIG. 3C illustrates a lateral cross-section view of an example DFD transistor including a DFD gate structure that includes a vertical portion in accordance with the teachings of the present invention.
Figure 3C:
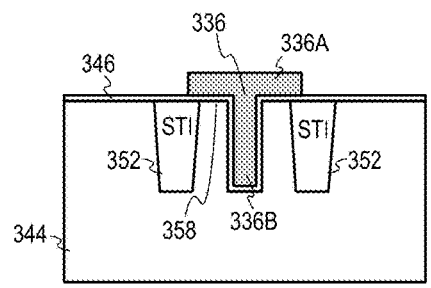

FIG. 3C illustrates a lateral cross-section view of an example DFD transistor 336 including a DFD gate structure that with a vertical portion in accordance with the teachings of the present disclosure. It is appreciated that the example DFD transistor 336 illustrated in FIG. 3C may be a lateral cross-section view of the example of the DFD transistor 336 of FIG. 3A along dashed line B-B', or one example of the DFD gate structure of DFD transistor 236 of FIG. 2, or one example of the DFD transistors included in pixel circuits 104 as shown in FIG. 1, and that similarly named and numbered elements described above are coupled and function similarly below.

As shown in the lateral cross-section view of the example depicted in FIG. 3C, the DFD gate structure of DFD transistor 336 includes a planar gate portion 336A disposed over a surface 358 of a semiconductor substrate 344. In one example, the surface 358 is a front side surface of semiconductor substrate 344. In one example, the surface 358 is a non-illuminated surface of semiconductor substrate 344. In the example, the DFD gate structure of DFD transistor 336 also includes a vertical gate portion 336B, which extends vertically from the planar gate portion 336A into the semiconductor substrate 344 between source/drain regions of the DFD transistor 336.

In the depicted example, it is further appreciated that the channel and the source/drain regions of DFD transistor 336 are isolated from the active pixel region in the semiconductor substrate 344 with STI structures 352 that are disposed in the semiconductor substrate 344 along lateral sides of the DFD transistor 336 as shown. In the depicted example, it is appreciated that the depth that the vertical gate structure 336B extends vertically into the semiconductor substrate 344 is approximately the same as the depth that the STI structures 352 extend vertically into the semiconductor substrate 344. In operation, the vertical gate portion 336B of the DFD gate structure 336 is configured to increase a gate to substrate coupling capacitance of the DFD transistor 336. As discussed above, the gate to substrate coupling capacitance provided with DFD gate structure of DFD transistor 336 is configured to increase an effective capacitance associated with a floating diffusion coupled to the DFD transistor 336 in response to the DFD transistor 336 being turned on during LCG operation in accordance with the teachings of the present invention.

Figure 4A:
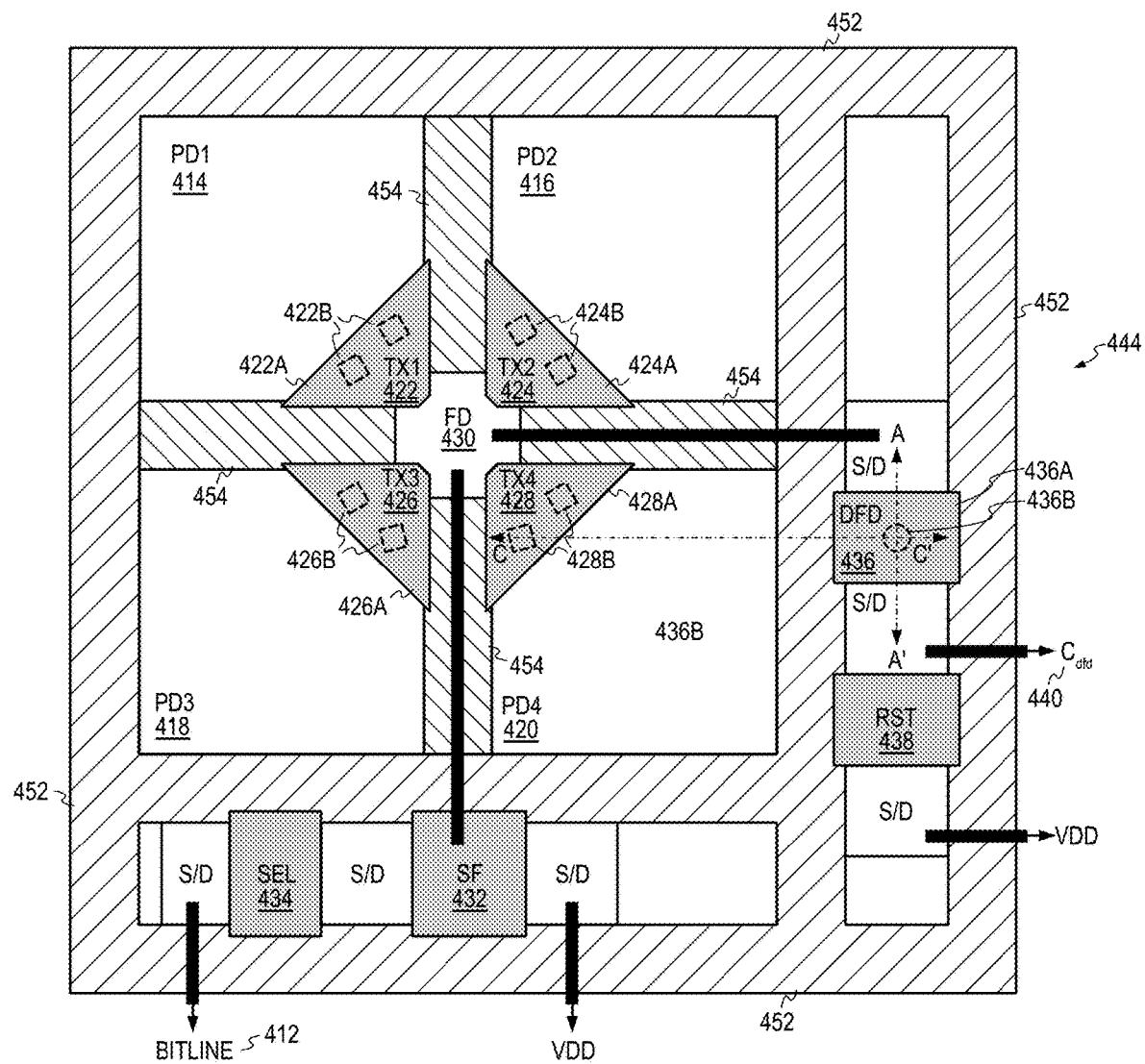
FIG. 4A illustrates a plan view of an example pixel circuit including a plurality of photodiodes and a DFD transistor with an example DFD gate structure that includes a vertical portion in accordance with the teachings of the present invention.

FIG. 4A illustrates a plan view of an example pixel circuit 404 including a plurality of photodiodes and a DFD transistor with an example DFD gate structure that includes a vertical portion in accordance with the teachings of the present invention. It is appreciated that the example of pixel circuit 404 of FIG. 4A may be one example of the pixel circuit 204 of FIG. 2 or of pixel circuits 104 of the pixel array 102 as shown in FIG. 1. Furthermore, it is appreciated that the DFD transistor 436 illustrated in FIG. 4A may be one example of the DFD transistors 336 illustrated in FIGS. 3A-3C, or one example of the DFD transistor 236 of FIG. 2, or one example of the DFD transistors included in pixel circuits 104 as shown in FIG. 1, and that similarly named and numbered elements described above are coupled and function similarly below.

As shown in the plan view example depicted in FIG. 4A, pixel circuit 404 includes a floating diffusion FD 430, which is disposed in a semiconductor substrate 444. In the depicted example, pixel circuit 404 also includes a plurality of photodiodes, including photodiode PD1 414, photodiode PD2 416, photodiode PD3 418, and photodiode PD4 420, which are disposed in the semiconductor substrate 444. In the example, photodiode PD1 414, photodiode PD2 416, photodiode PD3 418, and photodiode PD4 420 are configured to generate image charge in response to incident light.

It is appreciated that in the depicted example, pixel circuit 404 includes four photodiodes surrounding the floating diffusion FD 430 in the semiconductor substrate 444 for explanation purposes, and that in another example, pixel circuit 404 may also include a single photodiode. In yet another example, pixel circuit 404 may also include a greater number of photodiodes.

Continuing with the depicted example, a first transfer gate 422 is on a surface of the semiconductor substrate 444 between photodiode PD1 414 and floating diffusion FD 430. Similarly, a second transfer gate 424 is on the surface of the semiconductor substrate 444 between photodiode PD2 416 and floating diffusion FD 430. A third transfer gate 426 is on the surface of the semiconductor substrate 444 between photodiode PD3 418 and floating diffusion FD 430. A fourth transfer gate 428 is on the surface of the semiconductor substrate 444 between photodiode PD4 420 and floating diffusion FD 430. In one example, the first transfer gate 422, the second transfer gate 424, the third transfer gate 426, and the fourth transfer gate 428 are formed with polysilicon or other suitable material. It is appreciated that in the example depicted in FIG. 4A, that there is one transfer gate for each photodiode. Therefore, in an example in which there is only one photodiode, there is only one transfer gate.

In the depicted example, it is noted that first transfer gate 422 includes a planar gate portion 422A disposed over the surface of the semiconductor substrate 444 and one or more vertical gate portions 422B, which extend vertically from the planar gate portion 422A into the semiconductor substrate 444. Similarly, second transfer gate 424 includes a planar gate portion 424A disposed over the surface of the semiconductor substrate 444 and one or more vertical gate portions 424B, which extend vertically from the planar gate portion 424A into the semiconductor substrate 444. Third transfer gate 426 includes a planar gate portion 426A disposed over the surface of the semiconductor substrate 444 and one or more vertical gate portions 426B, which extend vertically from the planar gate portion 426A into the semiconductor substrate 444. Fourth transfer gate 428 includes a planar gate portion 428A disposed over the surface of the semiconductor substrate 444 and one or more vertical gate portions 428B, which extend vertically from the planar gate portion 428A into the semiconductor substrate 444. In operation, the first transfer gate 422, second transfer gate 424, third transfer gate 426, and fourth transfer gate 428 are configured to transfer the image charge photogenerated in photodiode PD1 414, photodiode PD2 416, photodiode PD3 418, and photodiode PD4 420 to floating diffusion 430 in response to transfer gate signals TX1, TX2, TX3, and TX4, respectively.

The illustrated example shows that pixel circuit 404 also includes a source follower transistor SF 432 having a drain (illustrated as a source/drain region S/D in FIG. 4A) coupled to a supply voltage VDD and a gate coupled to the floating diffusion FD 430. A row select transistor 434 is coupled to source follower transistor SF 432 and a column bitline 412 through respective source/drain regions S/D, and is coupled to be controlled in response to a select signal SEL. In operation, the source follower transistor SF 432 is coupled to output an image signal to the bitline 412 through row select transistor 434 in response to the image charge in the floating diffusion FD 430. In one example, a readout circuit (e.g., readout circuit 106 of FIG. 1) is coupled to bitline 412 to read out the image signal from bitline 412.

Continuing with the depicted example, pixel circuit 404 also includes a DFD transistor 436 coupled between the floating diffusion FD 430 and a DFD capacitor $C_{dfd}$ 440. In particular, the example shown in FIG. 4A shows that the DFD transistor 436 includes a first source/drain region S/D coupled to the floating diffusion FD 430 and a second source/drain region S/D coupled to the DFD capacitor $C_{dfd}$ 440 and a reset transistor 438. In particular, the DFD transistor 436 and the reset transistor 438 share a source/drain region S/D (e.g., second source/drain region S/D of DFD transistor 436). As shown, the reset transistor 438 is coupled between a supply voltage VDD and the DFD transistor 436. In operation, the reset transistor 438 may be configured to reset the floating diffusion FD 430 through DFD transistor 436, as well as reset photodiode PD1 414, photodiode PD2 416, photodiode PD3 418, and photodiode PD4 420 in response to a reset control signal RST, a DFD control signal DFD, and transfer gate control signals TX1, TX2, TX3, TX4.

In the depicted example, the DFD transistor 436 includes a DFD gate structure including a planar gate portion 436A disposed over the surface of the semiconductor substrate 444 and a vertical gate portion 436B, which extends vertically from the planar gate portion 436A into the semiconductor substrate 444 between the source/drain regions S/D and beneath the surface of the semiconductor substrate 444. As discussed above, the vertical gate portion 436B of the DFD gate structure is configured to increase a gate to substrate coupling capacitance of the DFD transistor 436 when the DFD transistor 436 is turned on. As such, the gate to substrate coupling capacitance of the DFD transistor 436 and the DFD capacitor $C_{dfd}$ 440 are coupled to increase an effective capacitance associated with the floating diffusion FD 430 to reduce conversion gain associated with pixel circuit 404 in response to the DFD transistor 436 being turned on.

In one example, it is appreciated that the vertical gate portion 436B of the DFD gate structure of the DFD transistor 436 may be formed in the same process as the vertical gate portions 422B, 424B, 426B, and 428B of the transfer gates 422, 424, 426, and 428, respectively. In various examples, the pillar structures of the vertical gate portion 436B of the DFD gate structure of the DFD transistor 436 may be the same or may be different than the pillar structures of the vertical gate portions 422B, 424B, 426B, and 428B of the transfer gates 422, 424, 426, and 428 in physical properties such as structure dimensions (e.g., pillar length or pillar width), structure shape, and gate material.

The example illustrated in FIG. 4A shows that pixel circuit 404 includes STI structures 452 disposed in the semiconductor material 444 that isolate the active pixel region in which the floating diffusion FD 430 and the photodiodes PD1 414, PD2 416, PD3 418, and PD4 420 are formed from the transistor region in which the source follower transistor 432 and the row select transistor 434 are formed, and from the transistor region in which the DFD transistor 436 and the reset transistor 438 are formed. The example illustrated in FIG. 4A also shows that pixel circuit 404 includes implanted isolation 454 disposed in the semiconductor material 444 to isolate the floating diffusion FD 430 and the photodiodes PD1 414, PD2 416, PD3 418, and PD4 420 from each other. In one example, the STI structures 452 may also be formed in implanted isolation 454.

In one example, implanted isolation 454 may be formed as a P-well isolation region implanted into the semiconductor substrate 444 to isolate the floating diffusion FD 430 and the photodiodes PD1 414, PD2 416, PD3 418, and PD4 420 from each other. For instance, in one example, the semiconductor substrate 444 is a silicon substrate and the implanted isolation 454 is formed in the silicon substrate as a P-well isolation region implanted with P-type dopants, e.g., boron, having an opposite conductivity type than N type dopants (e.g., phosphorus, arsenic) that are implanted to form photodiodes PD1 414, PD2 416, PD3 418, PD4 420, and floating diffusion FD 430. In one example, implanted isolation 454 is an epitaxial layer (e.g., in-situ P-type doped epitaxial layer) grown on the semiconductor substrate 444. In one example, the photodiode regions of the first photodiode PD1 414, second photodiode PD2 416, third photodiode PD3 418, fourth photodiode PD4 420 are all fabricated using photolithography and implantation to form the respective photodiode regions.

Figure 4B:
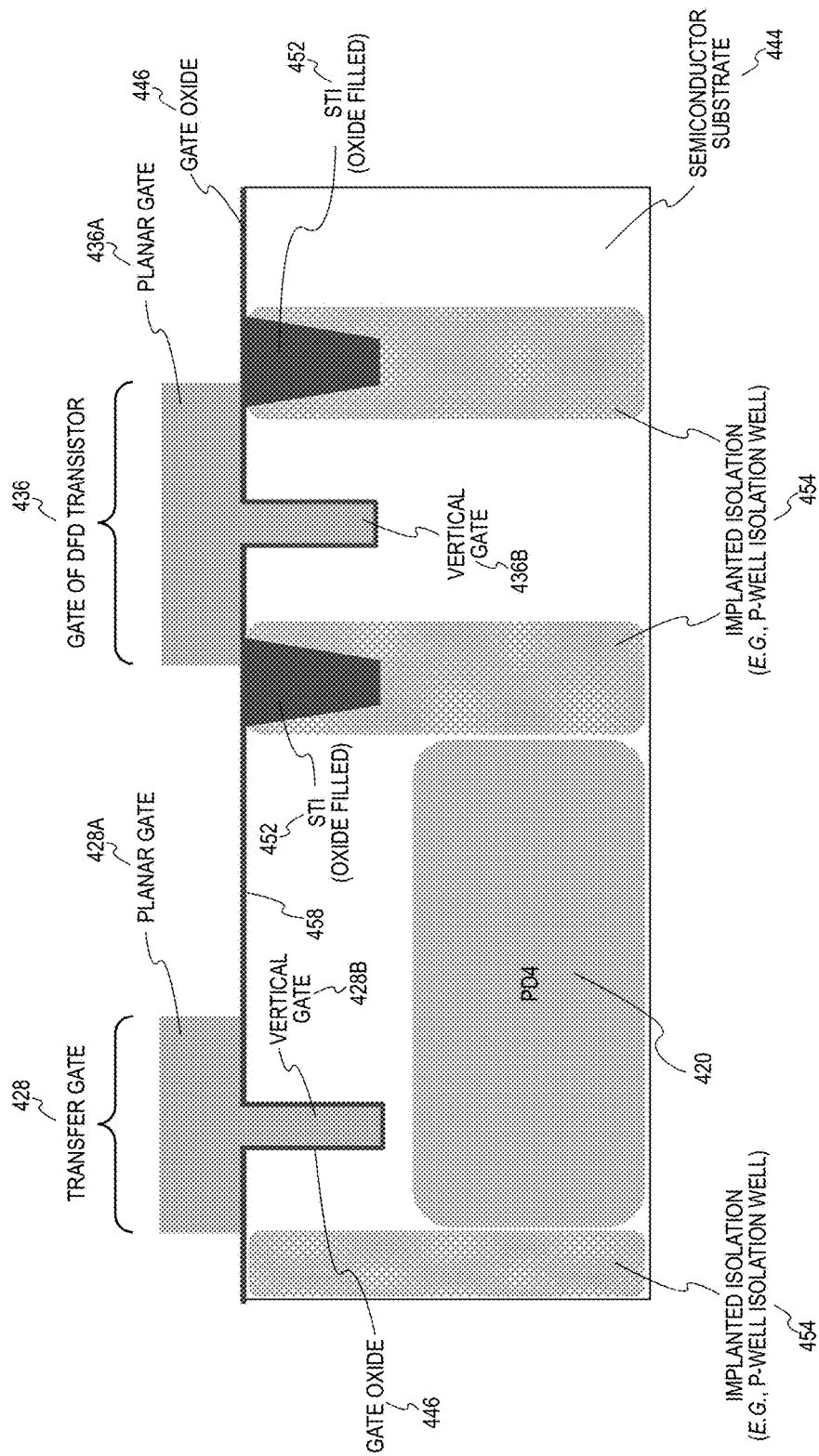
FIG. 4B illustrates a cross-section view of an example pixel circuit including a plurality of photodiodes and a DFD transistor with an example DFD gate structure that includes a vertical portion in accordance with the teachings of the present invention.

FIG. 4B illustrates a cross-section view of an example pixel circuit 404 including a plurality of photodiodes and a DFD transistor with an example DFD gate structure that includes a vertical portion in accordance with the teachings of the present invention. It is appreciated that the example of pixel circuit 404 of FIG. 4B may be a cross-section view of the example of the pixel circuit 404 of FIG. 4A along dashed-line C-C', and that similarly named and numbered elements described above are coupled and function similarly below.

As shown in the depicted cross-section view example, pixel circuit 404 includes a photodiode 420 disposed in a semiconductor substrate 444. Photodiode 420 is configured to photogenerate image charge in response to incident light. A transfer gate is disposed on a surface 458 of the semiconductor substrate 444 proximate to photodiode 420 and between the photodiode 420 and a floating diffusion (e.g., floating diffusion FD 430 shown in FIG. 4A). In the depicted example, it is noted that transfer gate 428 includes a planar gate portion 428A disposed over the surface 458 of the semiconductor substrate 444 and one or more vertical gate portions 428B, which extend vertically from the planar gate portion 422A into the semiconductor substrate 444. In one example, surface 458 is a non-illuminated surface of semiconductor substrate 444. As shown in the depicted example, a gate oxide 446 is disposed between the planar gate portion 428A and vertical gate portion 428B of transfer gate 428 and semiconductor substrate 444. In operation, the transfer gate is 428 configured to transfer image charge from the photodiode 420 to the floating diffusion FD 430.

In the example, pixel circuit also includes a dual floating diffusion (DFD) transistor 436, which is coupled between the floating diffusion and a DFD capacitor (e.g., DFD capacitor $C_{dfd}$ 440 shown in FIG. 4A). In the depicted example, it is noted that DFD transistor 436 includes a DFD gate structure including a planar gate portion 436A disposed over the surface 458 of the semiconductor substrate 444 and one or more vertical gate portions 436B, which extend vertically from the planar gate portion 436A into the semiconductor substrate 444. As shown in the depicted example, the gate oxide 446 is disposed between the planar gate portion 436A and vertical gate portion 436B of DFD transistor 436 and semiconductor substrate 444. In operation, the gate structure of DFD transistor 436 is configured to increase a gate to substrate coupling capacitance of the DFD transistor 436 when the DFD transistor 436 is turned on. As such, the gate to substrate coupling capacitance of the DFD transistor 436 and the DFD capacitor $C_{dfd}$ 440 are coupled to increase an effective capacitance associated with the floating diffusion FD 430 to reduce conversion gain associated with pixel circuit 404 in response to the DFD transistor 436 being turned on.

In one example, it is appreciated that the vertical gate portion 436B of the DFD gate structure of the DFD transistor 436 may be formed in the same process as the vertical gate portion 428B of the transfer gates 428. In various examples, the pillar structures of the vertical gate portion 436B of the DFD gate structure of the DFD transistor 436 may be the same or may be different than the pillar structure of the vertical gate portion 428B of the transfer gate 428 in physical properties such as structure dimensions (e.g., pillar length or pillar width), structure shape, and gate material.

The example illustrated in FIG. 4B also shows that pixel circuit 404 includes implanted isolation 454 disposed in the semiconductor material 444, which may be formed to isolate the floating diffusion FD 430 and the photodiodes, including photodiode 420, from each other. For instance, in one example the semiconductor substrate 444 is a silicon substrate and the implanted isolation 454 is formed in the silicon substrate as a P-well isolation well region implanted with P-type dopants, e.g., boron, having an opposite conductivity type than N type dopants (e.g., phosphorus, arsenic) that are implanted to form photodiodes, including photodiode 420, and floating diffusion FD 430. In one example, implanted isolation 454 is an epitaxial layer (e.g., in-situ P-type doped epitaxial layer) grown on the semiconductor substrate 444. In one example, the photodiode regions, including photodiode 420, are all fabricated using photolithography and implantation to form the respective photodiode regions.

In one example, the STI structures 452 may also be formed in implanted isolation 454 as shown. In one example, the STI structures 452 are filled with oxide. In the depicted example, it is appreciated that the depth that the vertical gate structure 436B extends vertically into the semiconductor substrate 444 is approximately the same as the depth that the STI structures 452 extend vertically into the implanted isolation 454 in the semiconductor substrate 444. In one example, the STI structures 452 are utilized to isolate the active pixel region in which the floating diffusion FD 430 and the photodiodes, including photodiode 420, are formed from the transistor region in which the source follower transistor 432 and the row select transistor 434 (e.g., shown in FIG. 4A) are formed, and from the transistor region in which the DFD transistor 436 and the reset transistor 438 (e.g., shown in FIG. 4A) are formed.

Figure 5A:
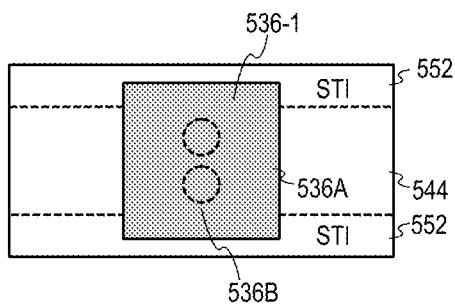
FIG. 5A illustrates a plan view of an example DFD transistor including a DFD gate structure that includes two vertical portions in accordance with the teachings of the present invention.

FIG. 5A illustrates a plan view of an example DFD transistor 536-1 including a DFD gate structure that includes an M×N arrangement of vertical portions in accordance with the teachings of the present disclosure. In particular, the example depicted in FIG. 5A illustrates an example in which M=2 and N=1 such that the DFD gate structure includes a 2×1 arrangement of vertical portions. It is appreciated that the example DFD transistor 536-1 of FIG. 5A may be an example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5A, the DFD transistor 536-1 includes a DFD gate structure with a planar gate portion 536A disposed over the surface of a semiconductor substrate 544. In the illustrated example, the DFD gate structure of DFD transistor 536-1 also includes the two vertical gate portions 536B. In the example, it is noted that the pillar structures of the two vertical gate portions 536B illustrated in FIG. 5A have a circular shaped cross-section as shown.

In the depicted example, the two vertical gate portions 536B are arranged laterally across a channel of DFD transistor 536-1 in an M×N arrangement (e.g., M=2, N=1) and extend vertically from the planar gate portion 536A into the semiconductor substrate 544 between source/drain regions of the DFD transistor 536-1. It is appreciated that in one example, the channel of the DFD transistor 536-1 is formed in the semiconductor substrate 544 beneath the DFD gate structure, including underneath the planar gate portion 536A, along part of the bottom and/or side walls of the vertical gate portions 536B, between source/drain regions in the semiconductor substrate 544 of the DFD transistor 536-1 when DFD transistor 536-1 turns on.

In the depicted example, it is further appreciated that the channel and the source/drain regions of DFD transistor 536-1 are isolated from the active pixel region in the semiconductor substrate 544 with STI structures 552 that are disposed in the semiconductor substrate 544 along lateral sides of the DFD transistor 536-1 as shown. The two vertical gate portions 536B of the DFD gate structure of DFD transistor 536-1 are configured to increase a gate to substrate coupling capacitance of the DFD transistor 536-1 when the DFD-transistor 536-1 is turned on. As discussed above, the gate to substrate coupling capacitance provided with DFD gate structure of DFD transistor 536-1 is configured to increase an effective capacitance associated with a floating diffusion coupled to the DFD transistor 536-1 in response to the DFD transistor 536-1 being turned on during LCG operation in accordance with the teachings of the present invention.

Figure 5B:
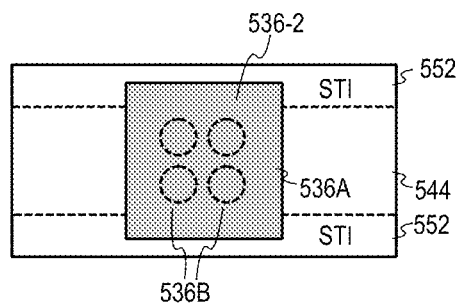
FIG. 5B illustrates a plan view of another example DFD transistor including a DFD gate structure that includes four vertical portions in accordance with the teachings of the present invention.

FIG. 5B illustrates a plan view of another example DFD transistor 536-2 including a DFD gate structure that includes an M×N arrangement of vertical portions in accordance with the teachings of the present disclosure. In particular, the example depicted in FIG. 5B illustrates an example in which M=2 and N=2 such that the DFD gate structure includes a 2×2 arrangement of vertical portions. It is appreciated that the example DFD transistor 536-2 of FIG. 5B may be another example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5B, the DFD transistor 536-2 includes a DFD gate structure with a planar gate portion 536A disposed over the surface of a semiconductor substrate 544. In the illustrated example, the DFD gate structure of DFD transistor 536-2 also includes four vertical gate portions 536B. In the example, it is noted that the pillar structures of the four vertical gate portions 536B illustrated in FIG. 5B have a circular shaped cross-section as shown.

As shown in the depicted example, the four vertical gate portions 536B have a M×N arrangement (e.g., M=2, N=2) disposed laterally across a channel of DFD transistor 536-2 and extend vertically from the planar gate portion 536A into the semiconductor substrate 544 between source/drain regions of the DFD transistor 536-2. It is appreciated that the channel of the DFD transistor 536-2 is formed in the semiconductor substrate 544 beneath the DFD gate structure including underneath the planar gate portion 536A, along bottom and/or side walls of the vertical gate portions 536B between the pair of source/drain regions of DFD transistor 536-2 in the semiconductor substrate 544 of the DFD transistor 536-2 when DFD transistor 536-2 turns on.

In the depicted example, the four vertical gate portions 536B are arranged with equal spacing in between. In another example, there may be different spacing between the four vertical gate portions 536B. For instance, in one example the vertical spacing between adjacent vertical gate portions 536B as shown in FIG. 5B may be different from the horizontal spacing between adjacent vertical gate portions 536B depending on the gate size of the DFD transistor 536-2.

In the depicted example, four vertical gate portions 536B are aligned in both vertical and horizontal direction; however, four vertical gate portions 536B can be arranged in different alignments depending on the gate size of the DFD gate structure of DFD transistor 536-2.

In one example, the four vertical gate portions 536B have same gate depth in the semiconductor substrate with respect to front-surface of the semiconductor substrate, however, the four vertical gate portions 536B can have different depths depending on required increasing in effective capacitance associated with floating diffusion coupled to the DFD transistor 536-2.

In the depicted example, it is further appreciated that the channel and the source/drain regions of DFD transistor 536-2 are isolated from the active pixel region in the semiconductor substrate 544 with STI structures 552 that are disposed in the semiconductor substrate 544 along lateral sides of the DFD transistor 536-2 as shown. The four vertical gate portions 536B of the DFD gate structure of DFD transistor 536-2 are configured to increase a gate to substrate coupling capacitance of the DFD transistor 536-2. As discussed above, the gate to substrate coupling capacitance provided with DFD gate structure of DFD transistor 536-2 is configured to increase an effective capacitance associated with a floating diffusion coupled to the DFD transistor 536-2 in response to the DFD transistor 536-2 being turned on during LCG operation in accordance with the teachings of the present invention.

Figure 5C:
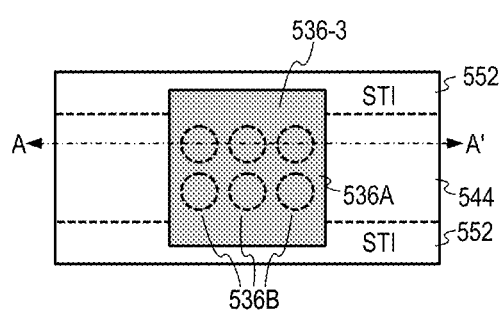
FIG. 5C illustrates a plan view of yet another example DFD transistor including a DFD gate structure that includes six vertical portions in accordance with the teachings of the present invention.

FIG. 5C illustrates a plan view of yet another example DFD transistor 536-3 including a DFD gate structure that includes an M×N arrangement of vertical portions in accordance with the teachings of the present disclosure. In particular, the example depicted in FIG. 5C illustrates an example in which M=2 and N=3 such that the DFD gate structure includes a 2×3 arrangement of vertical portions. It is appreciated that the example DFD transistor 536-3 of FIG. 5C may be yet another example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5C, the DFD transistor 536-3 includes a DFD gate structure with a planar gate portion 536A disposed over the surface of a semiconductor substrate 544. In the illustrated example, the DFD gate structure of DFD transistor 536-3 also includes six vertical gate portions 536B. In the example, it is noted that the pillar structures of the six vertical gate portions 536B illustrated in FIG. 5C have a circular shaped cross-section as shown.

As shown in the depicted example, the six vertical gate portions 536B have a M×N arrangement (e.g., M=2, N=3) arrangement that are disposed as 3 lateral pairs of vertical gate portions 536B disposed along a channel length direction of DFD transistor 536-3 between source/drain regions of DFD transistor 536-3 as shown. The six vertical gate portions 536B extend vertically from the planar gate portion 536A into the semiconductor substrate 544 between source/drain regions of the DFD transistor 536-3. It is appreciated that the channel of the DFD transistor 536-3 may be formed in the semiconductor substrate 544 beneath the DFD gate structure including underneath the planar gate portion 536A, along bottom and/or side walls of the vertical gate portions 536B between source/drain regions in the semiconductor substrate 544 of the DFD transistor 536-3.

In one example, the six vertical gate portions 536B of DFD transistor 536-3 are equally spaced. In another example, different spacing between the six vertical gate portions 536B DFD transistor 536-3 may be arranged. For instance, in one example the vertical spacing between adjacent vertical gate portions 536B as shown in FIG. 5C may be different from the horizontal spacing between adjacent vertical gate portions 536B depending on the gate size of the DFD gate structure DFD transistor 536-3.

In the depicted example, it is further appreciated that the channel and the source/drain regions of DFD transistor 536-3 are isolated from the active pixel region in the semiconductor substrate 544 with STI structures 552 that are disposed in the semiconductor substrate 544 along lateral sides of the DFD transistor 536-3 as shown. The six vertical gate portions 536B of the DFD gate structure of DFD transistor 536-3 are configured to increase a gate to substrate coupling capacitance of the DFD transistor 536-3. As discussed above, the gate to substrate coupling capacitance provided with DFD gate structure of DFD transistor 536-3 is configured to increase an effective capacitance associated with a floating diffusion coupled to the DFD transistor 536-3 in response to the DFD transistor 536-3 being turned on during LCG operation in accordance with the teachings of the present invention.

Figure 5D:
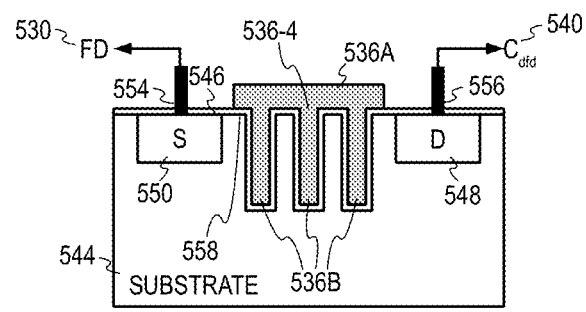
FIG. 5D illustrates a longitudinal cross-section view of an example DFD transistor including a DFD gate structure that includes six vertical portions in accordance with the teachings of the present invention.

FIG. 5D illustrates a longitudinal cross-section view of an example DFD transistor 536-4 including a DFD gate structure that includes six vertical portions in accordance with the teachings of the present disclosure. It is appreciated that the example DFD transistor 536-4 illustrated in FIG. 5D may be a longitudinal cross-section view of the example of the DFD transistor 536-3 of FIG. 5C along dashed line A-A', or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the longitudinal cross-section view of the example depicted in FIG. 5D, the DFD gate structure of DFD transistor 536-4 includes a planar gate portion 536A disposed over a surface 558 of a semiconductor substrate 544. In one example, the surface 558 is a front side surface of semiconductor substrate 544. In the example, the DFD gate structure of DFD transistor 536-4 also includes a six vertical gate portions 536B of which only three are visible in the longitudinal cross-section view of FIG. 5D. As shown, the vertical gate portions 536B extend vertically from the planar gate portion 536A into the semiconductor substrate 544 along a channel length direction of the DFD transistor 536-4 between source/drain regions of the DFD transistor 536-4. In one example, the channel of DFD transistor 536-4 is formed beneath the DFD gate structure, including along bottom and/or side walls of vertical gate portions 536B, beneath the surface 558 of the semiconductor substrate 544 underneath planar gate portion 536A, between source region 550 and drain region 548 of the DFD transistor 536-4 when the DFD transistor 536-4 turns on. As shown, in various examples, the depths of vertical gate portions 536B are deeper than the depths of source region 550 and drain region 548 in semiconductor substrate 544.

In one example, the source region 550 is coupled to a floating diffusion FD 530 through a conductive path 554, and the drain region 548 is coupled to a DFD capacitor $C_{dfd}$ 540 through a conductive path 556. In the various examples, it is appreciated that conductive paths 554 and 556 may include contacts and metal layer interconnects that are formed in one or more interlayer dielectric layers of a chip on which the pixel circuit including the DFD transistor 536-4 is fabricated. As shown in the example depicted in FIG. 5D, it is appreciated that a thin gate oxide layer 546 is formed between the DFD gate structure of DFD transistor 536-4 and the semiconductor substrate 544.

In one example, the vertical gate portions 536B have same gate depth in the semiconductor substrate 544 with respect to front surface 558 of the semiconductor substrate 544; however, the vertical gate portions 536B can have different depths depending on required increasing in effective capacitance associated with floating diffusion coupled to the DFD transistor 536-4. The vertical gate portions 536B of the DFD gate structure of DFD transistor 536-4 are configured to increase a gate to substrate coupling capacitance of the DFD transistor 536-4. As discussed above, the gate to substrate coupling capacitance provided with DFD gate structure of DFD transistor 536-4 is configured to increase an effective capacitance associated with the floating diffusion FD 530 that is coupled to the DFD transistor 536-4 in response to the DFD transistor 536-4 being turned on during LCG operation in accordance with the teachings of the present invention.

Figure 5E:
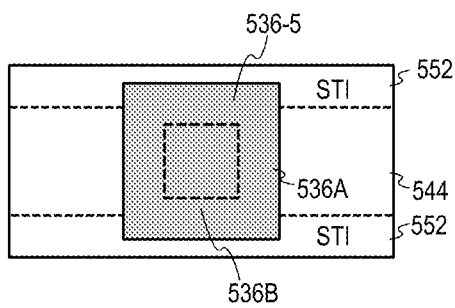
FIG. 5E illustrates a plan view of still another example DFD transistor including a DFD gate structure that includes a vertical portion in accordance with the teachings of the present invention.

FIG. 5E illustrates a plan view of still another example DFD transistor 535-5 including a DFD gate structure that includes a vertical portion in accordance with the teachings of the present disclosure. It is appreciated that the example DFD transistor 536-5 of FIG. 5E may be an example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5E, the DFD transistor 536-5 includes a DFD gate structure with a planar gate portion 536A disposed over the surface of a semiconductor substrate 544. In the illustrated example, the DFD gate structure of DFD transistor 536-5 also includes a vertical gate portion 536B. In the example, it is noted that the pillar structure of the vertical gate portions 536B illustrated in FIG. 5E has a polygon or square shaped cross-section as shown. In other examples, it is appreciated that the polygon shaped cross-section of the pillar structure of the vertical gate portions 536B illustrated in FIG. 5E may have a different shape or a different number of sides (e.g., less than four or greater than four) in accordance with the teachings of the present invention.

In the depicted example, the vertical gate portion 536B extends vertically from the planar gate portion 536A into the semiconductor substrate 544 between source/drain regions of the DFD transistor 536-5. It is appreciated that in one example the channel of the DFD transistor 536-5 is formed in the semiconductor substrate 544 beneath the DFD gate structure, including underneath planar gate portion 536A, along bottom and/or side walls of the vertical gate portion 536B, between source/drain regions in the semiconductor substrate 544 of the DFD transistor 536-5 when the DFD transistor 536-5 turns on.

In the depicted example, it is further appreciated that the channel and the source/drain regions of DFD transistor 536-5 are isolated from the active pixel region in the semiconductor substrate 544 with STI structures 552 that are disposed in the semiconductor substrate 544 along lateral sides of the DFD transistor 536-5 as shown. The vertical gate portion 536B of the DFD gate structure of DFD transistor 536-5 is configured to increase a gate to substrate coupling capacitance of the DFD transistor 536-5. As discussed above, the gate to substrate coupling capacitance provided with DFD gate structure of DFD transistor 536-5 is configured to increase an effective capacitance associated with a floating diffusion coupled to the DFD transistor 536-5 in response to the DFD transistor 536-5 being turned on during LCG operation in accordance with the teachings of the present invention.

Figure 5F:
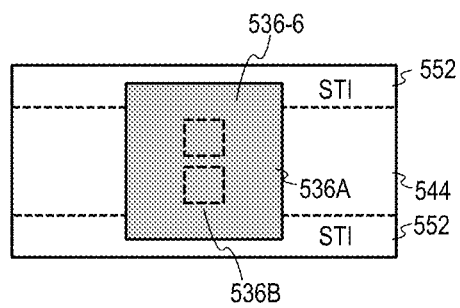
FIG. 5F illustrates a plan view of yet another example DFD transistor including a DFD gate structure that includes two vertical portions in accordance with the teachings of the present invention.

FIG. 5F illustrates a plan view of yet another example DFD transistor 536-6 including a DFD gate structure that includes two vertical portions in accordance with the teachings of the present disclosure. It is appreciated that the example DFD transistor 536-6 of FIG. 5F may be an example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5F, the DFD transistor 536-6 includes a DFD gate structure with a planar gate portion 536A disposed over the surface of a semiconductor substrate 544. In the illustrated example, the DFD gate structure of DFD transistor 536-6 also includes two vertical gate portions 536B. In the example, it is noted that the pillar structures of the two vertical gate portions 536B illustrated in FIG. 5F have polygon or square shaped cross-sections as shown. In other examples, it is appreciated that the polygon shaped cross-sections of the pillar structures of the vertical gate portions 536B illustrated in FIG. 5E may have different shapes or different numbers of sides (e.g., less than four or greater than four) in accordance with the teachings of the present invention.

In the depicted example, the two vertical gate portions 536B are arranged laterally across a channel of DFD transistor 536-6 in a 2×1 arrangement and extend vertically from the planar gate portion 536A into the semiconductor substrate 544 between source/drain regions of the DFD transistor 536-6. It is appreciated that the channel of the DFD transistor 536-6 in one example is formed in the semiconductor substrate 544 beneath the DFD gate structure, including underneath planar gate portion 536A, along bottom and/or side walls of the two vertical gate portions 536B, between source/drain regions in the semiconductor substrate 544 of the DFD transistor 536-6 when the DFD transistor 536-6 turns on.

In the depicted example, it is further appreciated that the channel and the source/drain regions of DFD transistor 536-6 are isolated from the active pixel region in the semiconductor substrate 544 with STI structures 552 that are disposed in the semiconductor substrate 544 along lateral sides of the DFD transistor 536-6 as shown. The two vertical gate portions 536B of the DFD gate structure of DFD transistor 536-6 are configured to increase a gate to substrate coupling capacitance of the DFD transistor 536-6. As discussed above, the gate to substrate coupling capacitance provided with DFD gate structure of DFD transistor 536-6 are configured to increase an effective capacitance associated with a floating diffusion coupled to the DFD transistor 536-6 in response to the DFD transistor 536-6 being turned on during LCG operation in accordance with the teachings of the present invention.

Figure 5G:
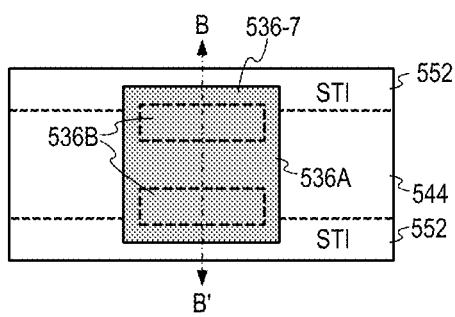
FIG. 5G illustrates a plan view of still another example DFD transistor including a DFD gate structure that includes two vertical portions that form vertical channels in the DFD transistor in accordance with the teachings of the present invention.

FIG. 5G illustrates a plan view of still another example DFD transistor 536-7 including a DFD gate structure that includes two vertical portions that form vertical channels in the DFD transistor in accordance with the teachings of the present disclosure. It is appreciated that the example DFD transistor 536-7 of FIG. 5G may be an example the DFD transistor 436 shown in FIG. 4A, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the plan view example depicted in FIG. 5G, the DFD transistor 536-7 includes a DFD gate structure with a planar gate portion 536A disposed over the surface of a semiconductor substrate 544. In the illustrated example, the DFD gate structure of DFD transistor 536-5 also includes two vertical gate portions 536B. In the example, it is noted that the pillar structures of the two vertical gate portions 536B illustrated in FIG. 5F are fin shaped structures and have rectangular shaped cross-sections as shown. In other examples, it is appreciated that the rectangular shaped cross-sections of the pillar structures of the vertical gate portions 536B illustrated in FIG. 5E may have different shapes or different numbers of sides (e.g., less than four or greater than four) in accordance with the teachings of the present invention.

In the depicted example, the two fin shaped vertical gate portions 536B are arranged on lateral sides of the channel of DFD transistor 536-7 and extend vertically from the planar gate portion 536A into the semiconductor substrate 544 along the lateral sides of channel of the DFD transistor 536-7 that is created between source/drain regions of the DFD transistor 536-7. Restated, the two fin shaped vertical gate portions 536B are formed in the semiconductor substrate 544 along a channel width direction of DFD transistor 536-7 and increase an effective gate width of DFD transistor 536-7, which thereby could increase the operational speed of the vertical gate portions 536B. It is appreciated that the channel of the DFD transistor 536-7 in one example is formed in the semiconductor substrate 544 beneath the DFD gate structure, including underneath planar gate portion 536A, along bottom and/or portions of side walls of the two vertical gate portions 536B, between source/drain regions in the semiconductor substrate 544 of the DFD transistor 536-7 when the DFD transistor 536-7 turns on.

In the depicted example, it is further appreciated that the channel and the source/drain regions of DFD transistor 536-7 are isolated from the active pixel region in the semiconductor substrate 544 with STI structures 552 that are disposed in the semiconductor substrate 544 along lateral sides of the DFD transistor 536-7 as shown. In the depicted example, it is noted that the two fin shaped vertical gate portions 536B are disposed proximate or adjacent to the STI structures 552 that are disposed along the lateral sides of the channel of DFD transistor 536-7. The two vertical gate portions 536B of the DFD gate structure of DFD transistor 536-7 are configured to increase a gate to substrate coupling capacitance of the DFD transistor 536-7. As discussed above, the gate to substrate coupling capacitance provided with DFD gate structure of DFD transistor 536-7 are configured to increase an effective capacitance associated with a floating diffusion coupled to the DFD transistor 536-7 in response to the DFD transistor 536-7 being turned on during LCG operation in accordance with the teachings of the present invention.

Figure 5H:
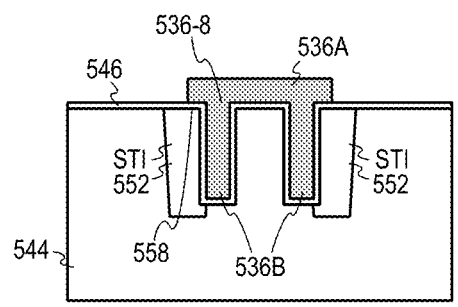
FIG. 5H illustrates a lateral cross-section view of an example DFD transistor including a DFD gate structure that includes two vertical portions that form vertical channels in the DFD transistor in accordance with the teachings of the present invention.

FIG. 5H illustrates a lateral cross-section view of an example DFD transistor 536-8 including a DFD gate structure that includes two vertical portions that form vertical channels in the DFD transistor in accordance with the teachings of the present disclosure. It is appreciated that the example DFD transistor 536-8 illustrated in FIG. 5H may be a lateral cross-section view of the example of the DFD transistor 536-7 of FIG. 5G along dashed line B-B', or along a channel width direction of DFD transistor 536-7, or an example of DFD transistors 336 shown in FIGS. 3A-3C, or an example of the DFD transistor 236 of FIG. 2, or an example of the DFD transistors included in pixel circuits 104 as shown in FIG. 1, and that similarly named and numbered elements described above are coupled and function similarly below.

As shown in the lateral cross-section view of the example depicted in FIG. 5H, the DFD gate structure of DFD transistor 536-8 includes a planar gate portion 536A disposed over a surface 558 of a semiconductor substrate 544. In the illustrated example, the DFD gate structure of DFD transistor 536-8 also includes two vertical gate portions 536B that are arranged laterally across the channel of DFD transistor 536-8 and extend vertically from the planar gate portion 536A into the semiconductor substrate 544 along lateral sides the channel of the DFD transistor 536-8 that is created between source/drain regions of the DFD transistor 536-8. It is appreciated that the channel of the DFD transistor 536-8 in one example is formed in the semiconductor substrate 544 beneath the DFD gate structure including underneath planar gate portion 536, along the bottom and/or side walls of the two vertical gate portions 536B, between source/drain regions in the semiconductor substrate 544 of the DFD transistor 536-8 when the DFD transistor 536-7 turns on.

In the example, the channel and the source/drain regions of DFD transistor 536-8 are isolated from the active pixel region in the semiconductor substrate 544 with STI structures 552 that are disposed in the semiconductor substrate 544 along lateral sides of the DFD transistor 536-8 as shown. In the example, it is noted that the two vertical gate portions 536B are disposed proximate or adjacent to the STI structures 552 that are disposed along the lateral sides of the channel of DFD transistor 536-8. As such, the portion of the channel of DFD transistor 536-8 is formed along the bottom and/or side walls of the two vertical gate portions 536B form a vertical channel along the lateral sides of the channel. In the example, each of two vertical gate portions 536B abuts STI structures 552 that is disposed adjacent thereto.

In operation, the two vertical gate portions 536B of the DFD gate structure of DFD transistor 536-8 with the vertical channel created along the bottom and/or part of side walls of the two vertical gate portions 536B are configured to increase a gate to substrate coupling capacitance of the DFD transistor 536-8. As discussed above, the gate to substrate coupling capacitance provided with DFD gate structure of DFD transistor 536-8 are configured to increase an effective capacitance associated with a floating diffusion coupled to the DFD transistor 536-8 in response to the DFD transistor 536-8 being turned on during a LCG operation in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
   a photodiode disposed in a semiconductor substrate, wherein the photodiode is configured to photogenerate image charge in response to incident light;
   a floating diffusion disposed in the semiconductor substrate;
   a transfer gate disposed on a surface of the semiconductor substrate between the photodiode and the floating diffusion, wherein the transfer gate is configured to transfer the image charge from the photodiode to the floating diffusion; and
   a dual floating diffusion (DFD) transistor coupled between the floating diffusion and a DFD capacitor, wherein the DFD transistor includes a DFD gate structure including:
      a planar gate portion disposed over the surface of the semiconductor substrate; and
      a vertical gate portion extending vertically from the planar gate portion into the semiconductor substrate, wherein the vertical gate portion of the DFD gate structure is configured to increase a gate to substrate coupling capacitance of the DFD transistor, wherein the gate to substrate coupling capacitance and the DFD capacitor are coupled to increase an effective capacitance associated with the floating diffusion in response to the DFD transistor being turned on.

2. The pixel circuit of claim 1, further comprising a gate oxide disposed between the DFD gate structure and the semiconductor substrate.

3. The pixel circuit of claim 2, wherein the gate oxide has a thickness of approximately 30 to 45 angstroms between the DFD gate structure and the semiconductor substrate.

4. The pixel circuit of claim 1, wherein a conversion gain of the pixel circuit is configured to be decreased in response to the DFD transistor being turned on, wherein the conversion gain of the pixel circuit is configured to be increased in response to the DFD transistor being turned off.

5. The pixel circuit of claim 1, wherein the vertical gate portion is a first vertical gate portion of a plurality of vertical gate portions included in the DFD gate structure, wherein each one of the plurality of vertical gate portions extends vertically from the planar gate portion into the semiconductor substrate between a source region and a drain region of the DFD transistor.

6. The pixel circuit of claim 5, wherein the plurality of vertical gate portions further includes a second vertical gate portion, wherein the first vertical gate portion and the second vertical gate portion are arranged along a channel width direction of the DFD transistor between the drain region and the source region of the DFD transistor to form vertical channels along the first vertical gate portion and the second vertical gate portion between the source region and the drain region of the DFD transistor.

7. The pixel circuit of claim 6, wherein the plurality of vertical gate portions are arranged in an M×N arrangement from the planar gate portion into the semiconductor substrate.

8. The pixel circuit of claim 1, wherein the transfer gate comprises:
   a planar gate portion disposed over the surface of the semiconductor substrate; and
   a vertical gate portion extending vertically from the planar gate portion of the transfer gate into the semiconductor substrate.

9. The pixel circuit of claim 8, wherein a pillar structure of the vertical gate portion of the transfer gate has a same pillar structure as a pillar structure of the DFD gate structure.

10. The pixel circuit of claim 1, wherein the photodiode is first photodiode of a plurality of photodiodes, wherein each one of the plurality of photodiodes is disposed in the semiconductor substrate and configured to photogenerate image charge in response to incident light.

11. The pixel circuit of claim 10, wherein the plurality of photodiodes further includes a second photodiode, a third photodiode, and a fourth photodiode arranged symmetrically in the semiconductor substrate around the floating diffusion, wherein the transfer gate is a first transfer gate of a plurality of transfer gates, wherein the plurality of transfer gates includes:
   the first transfer gate disposed on the surface of the semiconductor substrate between the first photodiode and the floating diffusion;
   a second transfer gate disposed on the surface of the semiconductor substrate between the second photodiode and the floating diffusion;
   a third transfer gate disposed on the surface of the semiconductor substrate between the third photodiode and the floating diffusion; and
   a fourth transfer gate disposed on the surface of the semiconductor substrate between the fourth photodiode and the floating diffusion.

12. The pixel circuit of claim 1, further comprising a plurality of shallow trench isolation (STI) structures disposed in the semiconductor substrate, wherein each one of the plurality of STI structures includes an oxide material, wherein each one of the plurality of STI structures is arranged in the semiconductor substrate to isolate active regions from transistor regions in the pixel circuit, wherein one of the active regions includes the photodiode and the floating diffusion, and one of the transistor regions includes the DFD transistor.

13. The pixel circuit of claim 12, further comprising a plurality of implanted isolation regions disposed in the semiconductor substrate, wherein the plurality of STI structures are formed in the plurality of implanted isolation regions.

14. The pixel circuit of claim 12, wherein the vertical gate portion of the DFD gate structure extends vertically from the planar gate portion into the semiconductor substrate between a first one of the plurality of STI structures and a second one of the plurality of STI structures.

15. The pixel circuit of claim 14, wherein the vertical gate portion of the DFD gate structure extends vertically from the planar gate portion into the semiconductor substrate to a same depth into the semiconductor substrate as the first one of the plurality of STI structures and the second one of the plurality of STI structures extend vertically into the semiconductor substrate.

16. An imaging system, comprising:
   a pixel array including a plurality of pixel circuits arranged in rows and columns, wherein each one of the pixel circuits is coupled to generate image charge in response to incident light;
   a control circuit coupled to the pixel array to control operation of the pixel array; and
   a readout circuit coupled to the pixel array to read out the image charge from each one of plurality of pixel circuits, wherein each one of the plurality of pixel circuits includes:
a photodiode disposed in a semiconductor substrate, wherein the photodiode is configured to photogenerate image charge in response to incident light;
a floating diffusion disposed in the semiconductor substrate;
a transfer gate disposed on a surface of the semiconductor substrate between the photodiode and the floating diffusion, wherein the transfer gate is configured to transfer the image charge from the photodiode to the floating diffusion; and
a dual floating diffusion (DFD) transistor coupled between the floating diffusion and a DFD capacitor, wherein the DFD transistor includes a DFD gate structure including:
a planar gate portion disposed over the surface of the semiconductor substrate; and
a vertical gate portion extending vertically from the planar gate portion into the semiconductor substrate, wherein the vertical gate portion of the DFD gate structure is configured to increase a gate to substrate coupling capacitance of the DFD transistor, wherein the gate to substrate coupling capacitance and the DFD capacitor are coupled to increase an effective capacitance associated with the floating diffusion in response to the DFD transistor being turned on.

17. The imaging system of claim 16, further comprising function logic coupled to the readout circuit to store digital representations of the image charge values from the pixel array.

18. The imaging system of claim 16, wherein each one of the plurality of pixel circuits further comprises a gate oxide disposed between the DFD gate structure and the semiconductor substrate.

19. The imaging system of claim 18, wherein the gate oxide has a thickness of approximately 30 to 45 angstroms between the DFD gate structure and the semiconductor substrate.

20. The imaging system of claim 16, wherein the vertical gate portion is a first vertical gate portion of a plurality of vertical gate portions included in the DFD gate structure, wherein each one of the plurality of vertical gate portions extends vertically from the planar gate portion into the semiconductor substrate between a source region and a drain region of the DFD transistor beneath the surface of the semiconductor substrate.

21. The imaging system of claim 20, wherein the plurality of vertical gate portions further includes a second vertical gate portion, wherein the first vertical gate portion and the second vertical gate portion are arranged along a channel width direction between the drain region and the source region of the DFD transistor to form vertical channels along the first vertical gate portion and the second vertical gate portion between the source region and the drain region of the DFD transistor.

22. The imaging system of claim 21, wherein the plurality of vertical gate portions are arranged in an M×N arrangement from the planar gate portion into the semiconductor substrate.

23. The imaging system of claim 16, wherein the transfer gate comprises:
a planar gate portion disposed over the surface of the semiconductor substrate; and
a vertical gate portion extending vertically from the planar gate portion of the transfer gate into the semiconductor substrate.

24. The imaging system of claim 23, wherein a pillar structure of the vertical gate portion of the transfer gate has a same pillar structure as a pillar structure of the DFD gate structure.

25. The imaging system of claim 16, wherein the photodiode is first photodiode of a plurality of photodiodes, wherein each one of the plurality of photodiodes is disposed in the semiconductor substrate and configured to photogenerate image charge in response to incident light.

26. The imaging system of claim 25, wherein the plurality of photodiodes further includes a second photodiode, a third photodiode, and a fourth photodiode arranged symmetrically in the semiconductor substrate around the floating diffusion.

27. The imaging system of claim 26, wherein the transfer gate is a first transfer gate of a plurality of transfer gates, wherein the plurality of transfer gates includes:
the first transfer gate disposed on the surface of the semiconductor substrate between the first photodiode and the floating diffusion;
a second transfer gate disposed on the surface of the semiconductor substrate between the second photodiode and the floating diffusion;
a third transfer gate disposed on the surface of the semiconductor substrate between the third photodiode and the floating diffusion; and
a fourth transfer gate disposed on the surface of the semiconductor substrate between the fourth photodiode and the floating diffusion.

28. The imaging system of claim 16, wherein each one of the plurality of pixel circuits further comprises a plurality of shallow trench isolation (STI) structures disposed in the semiconductor substrate, wherein each one of the plurality of STI structures includes an oxide material, wherein each one of the plurality of STI structures is arranged in the semiconductor substrate to isolate active regions from transistor regions in the pixel circuit, wherein one of active regions includes the photodiode and the floating diffusion, and one of transistor regions includes the DFD transistor.

29. The imaging system of claim 28, wherein the vertical gate portion of the DFD gate structure extends vertically from the planar gate portion into the semiconductor substrate between a first one of the plurality of STI structures and a second one of the plurality of STI structures.

30. The imaging system of claim 28, wherein the vertical gate portion of the DFD gate structure extends vertically from the planar gate portion into the semiconductor substrate to a same depth into the semiconductor substrate as the first one of the plurality of STI structures and the second one of the plurality of STI structures extend vertically into the semiconductor substrate.

* * * * *